United States Patent
Nakajima (10) Patent No.: US 7,262,590 B2
(45) Date of Patent: Aug. 28, 2007

(54) PERFORMANCE BOARD AND TESTING SYSTEM

(75) Inventor: Takahiro Nakajima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/082,186

(22) Filed: Mar. 16, 2005

(65) Prior Publication Data

US 2005/0212544 A1    Sep. 29, 2005

Related U.S. Application Data

(63) Continuation of application No. PCT/JP2003/011824, filed on Sep. 17, 2003.

(30) Foreign Application Priority Data

Sep. 17, 2002    (JP)    ............................. 2002-270801

(51) Int. Cl.
*G01R 31/28* (2006.01)
(52) U.S. Cl. .................................. 324/158.1
(58) Field of Classification Search ................ 324/763, 324/765, 158.1, 72.5; 361/777–780, 792–795; 174/262–266

See application file for complete search history.

(56) References Cited

U.S. PATENT DOCUMENTS

| | | | | |
|---|---|---|---|---|
| 4,764,723 A | * | 8/1988 | Strid | 324/765 |
| 6,400,164 B1 | * | 6/2002 | Sampath | 324/750 |
| 6,462,570 B1 | * | 10/2002 | Price et al. | 324/754 |
| 7,053,640 B2 | * | 5/2006 | Feld et al. | 324/755 |

FOREIGN PATENT DOCUMENTS

| | | |
|---|---|---|
| JP | 10-82 | 3/1998 |
| JP | 10-106677 | 4/1998 |
| JP | 10-107100 | 4/1998 |
| JP | 10-160799 | 6/1998 |
| JP | 11-083934 | 3/1999 |

OTHER PUBLICATIONS

Patent Abstracts of Japan, Publication No. 10-107100 dated Apr. 24, 1998, 1 page.
Patent Abstracts of Japan, Publication No. 10-106677 dated Apr. 24, 1998, 1 page.
Patent Abstracts of Japan, Publication No. 10-160799 date Jun. 19, 1998, 2 pages.
Patent Abstracts of Japan, Publication No. 11-083934 dated Mar. 26, 1999, 2 pages.
International Search Report issued in International Application No. PCT/JP03/11824 mailed Dec. 16, 2003, 2 pages.

* cited by examiner

*Primary Examiner*—Ha Tran Nguyen
*Assistant Examiner*—Tung X. Nguyen
(74) *Attorney, Agent, or Firm*—Osha Liang LLP (57) ABSTRACT

A performance board for allowing a device under test and a testing apparatus to be electrically coupled with each other, includes a base substrate on which the device under test is mounted, a first adaptor part provided with a plurality of coaxial connectors for allowing a plurality of coaxial cables electrically coupled to a plurality of first pins of the device under test respectively and the testing apparatus to be electrically coupled with each other and a second adaptor part provided with a plurality of via holes for allowing a plurality of wirings electrically coupled to a plurality of second pins of the device under test respectively and the testing apparatus to be electrically coupled with each other.

11 Claims, 10 Drawing Sheets

PERFORMANCE BOARD AND TESTING SYSTEM

The present application is a continuation application of PCT/JP2003/011824 filed on Sep. 17, 2003, which claims priority from a Japanese Patent Application No. 2002-270801 filed on Sep. 17, 2002, the contents of which are incorporated herein by reference.

FIELD OF THE INVENTION

The present invention relates to a performance board and a testing system. More particularly, the present invention relates to a performance board and a testing system capable of realizing an RF (Radio Frequency) test of an SOC (System On a Chip) device over a broadband with high precision, and further improving the operability of a user considerably. In addition, the present application claims the benefit of, and priority to, Japanese patent application No. 2002-270801 filed on Sep. 17, 2002, the entire contents of which are incorporated herein by reference for all purposes.

BACKGROUND ART

Recently, an SOC device in which various circuits such as an RF front-end circuit, a baseband circuit, a logic test circuit and the like are on one chip becomes increased. Accordingly, a demand for a testing system capable of performing various tests corresponding to the SOC device such as an RF test, a baseband test, a logic test and the like with high precision becomes strong.

Figure 1:
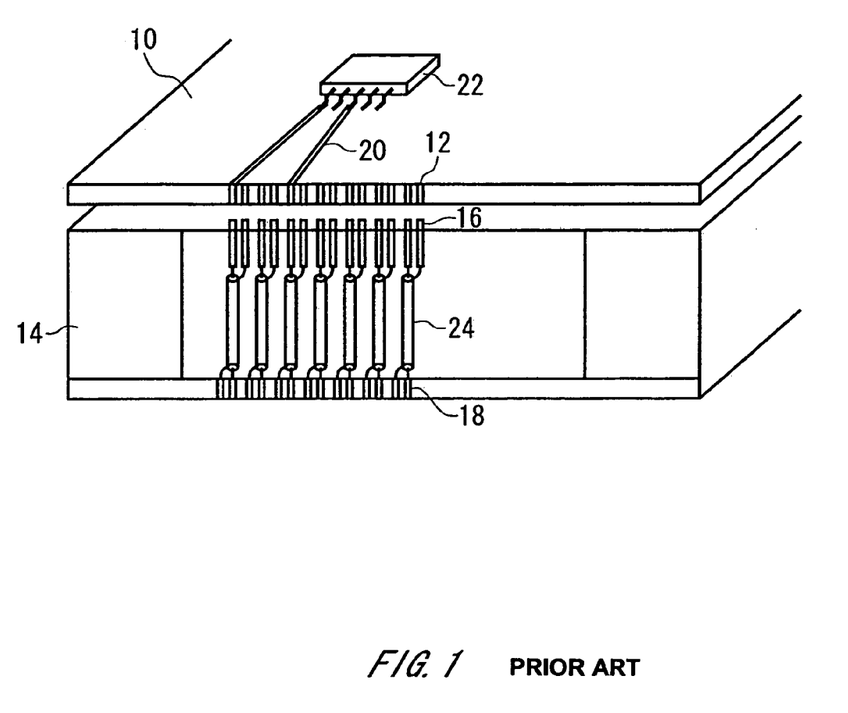
FIG. 1 shows the configuration of a conventional SOC testing system.

FIG. 1 shows the configuration of a conventional SOC testing system. In the conventional SOC testing system, a plurality of via holes 12 provided in a performance board 10 and a plurality of pogo pins 16 provided on an upper surface of a test fixture 14 are coupled with each other mechanically and electrically. In addition, a plurality of via holes 18 provided on the lower surface of the test fixture 14 is coupled to a test head of a testing apparatus mechanically and electrically. Wiring patterns 20 provided on the performance board 10 allows a device under test 22 and the via holes 12 to be coupled with each other, and coaxial cables 24 provided in the test fixture 14 and the via holes 18 allow the pogo pins 16 and the testing apparatus to be coupled with each other, so that the device under test 22 and the testing apparatus can be coupled with each other. Further, the testing apparatus supplies test signals to the device under test 22 via the performance board 10 and the test fixture 14 to perform the logic test or the like.

Figure 2:
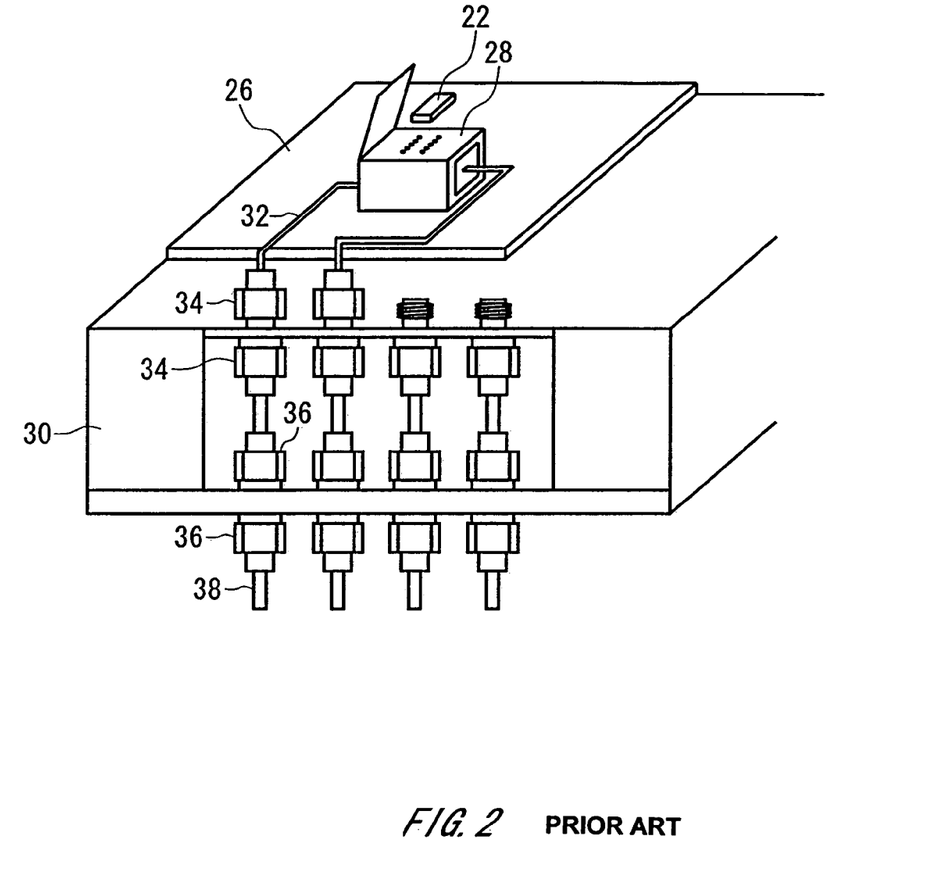
FIG. 2 shows the configuration of a conventional RF testing system.

FIG. 2 shows the configuration of a conventional RF testing system. In the conventional RF testing system, an RF test head 28 mounted on a performance board 26 and a test fixture 30 are electrically coupled with each other by coaxial cables 32 such as semi-rigid cables and coaxial connectors 34 such as SMA (Sub Miniature type A) connectors. In addition, the test fixture 30 and a testing apparatus are electrically coupled with each other by coaxial connectors 36 and coaxial cables 38. And, the testing apparatus supplies test signals to the device under test 22 via the coaxial cables and the coaxial connectors to perform the RF test or the like.

In addition, in order to automatically couple a prober mounting the device under test and the test head of the testing apparatus each other using the blind-mate connector, a floating mechanism of the blind-mate connector has been proposed (c.f. Japanese Patent Applications Publication Nos. 1998-106677 and 1998-107100).

In the SOC testing system shown in FIG. 1, although the performance board 10 is easily attached to or detached from the test fixture 14 so that the operability is good, in case of the RF test there is a problem such as a performance error caused by the frequency characteristics of the via holes 12 or the wiring patterns 20, the cross torque between the wiring patterns 20, the drawing-around of the wiring patterns 20, a performance error caused by the terminal process of the coaxial cables 24 and/or the like. In addition, in the RF testing system as shown in FIG. 2, although the device under test 28 and the testing apparatus are electrically coupled with each other by the coaxial cables and the coaxial connectors so that the frequency characteristics are good, there is a problem that the operability in attaching or detaching the performance board 10 to or from the test fixture 14 is bad because of the coaxial connectors 34, e.g. the SMA connectors.

Accordingly, it is an object of the present invention to provide a performance board and a testing system, which is capable of overcoming the above drawbacks accompanying the conventional art. The above and other objects can be achieved by combinations described in the independent claims. The dependent claims define further advantageous and exemplary combinations of the present invention.

DISCLOSURE OF THE INVENTION

In order to solve the problems above, according to the first aspect of the present invention, a performance board for allowing a device under test and a testing apparatus to be electrically coupled with each other, includes a base substrate on which the device under test is mounted, a first adaptor part provided with a plurality of coaxial connectors for allowing a plurality of coaxial cables electrically coupled to a plurality of first pins of the device under test respectively and the testing apparatus to be electrically coupled with each other and a second adaptor part provided with a plurality of via holes for allowing a plurality of wirings electrically coupled to a plurality of second pins of the device under test respectively and the testing apparatus to be electrically coupled with each other.

The base substrate may be provided with a plurality of wiring patterns coupled to the plurality of second pins of the device under test respectively, and the plurality of via holes may be electrically coupled to the plurality of second pins of the device under test respectively by the wiring patterns.

The first adaptor part may include an adaptor substrate arranged to be substantially parallel to the base substrate and provided with the plurality of coaxial connectors and a first elastic member provided at the adaptor substrate in order to allow a position of the adaptor substrate to change against the base substrate.

The first elastic member may be a spring member stretching and/or contracting in a direction within surfaces of the base substrate and the adaptor substrate.

The first adaptor part may include an adaptor substrate arranged to be substantially parallel to the base substrate and provided with the plurality of coaxial connectors and a plurality of second elastic members provided at the plurality of coaxial connectors respectively in order to allow positions of the plurality of coaxial connectors to change against the adaptor substrate.

The second elastic members may be spring members provided between the coaxial connectors and the second adaptor substrate and stretching and/or contracting in a direction within a surface of the adaptor substrate.

The first adaptor part may include an adaptor substrate arranged to be substantially parallel to the base substrate and provided with the plurality of coaxial connectors, a first elastic member provided at the adaptor substrate in order to allow a position of the adaptor substrate to change against the base substrate and a plurality of second elastic members provided at the plurality of coaxial connectors respectively in order to allow positions of the plurality of coaxial connectors to change against the adaptor substrate, and an allowable range of the first elastic member may be larger than an allowable range of the second elastic members.

The second adaptor part may be provided to be closer to the device under test than the first adaptor part.

The base substrate may be a rectangular shape, the first adaptor part may be provided near a corner of the base substrate and the second adaptor part may be provided along a side of the base substrate, wherein the corner is an end of the side.

The second adaptor parts may be provided along two sides of the base substrate, wherein the corner is an end of the sides.

The first adaptor parts may be provided near a plurality of corners of the base substrate respectively, and the second adaptor parts may be provided along a plurality of sides of the base substrate.

According to the second aspect of the present invention, a testing system for testing a device under test, includes a testing apparatus for generating a test signal to test the device under test and judging quality of the device under test, a performance board on which the device under test is mounted and a test fixture for allowing the testing apparatus and the performance board to be mechanically coupled with each other and allowing the testing apparatus and the device under test to be electrically coupled with each other, wherein the performance board includes a base substrate on which the device under test is mounted, a first adaptor part provided with a plurality of coaxial connectors for allowing a plurality of coaxial cables electrically coupled to a plurality of first pins of the device under test respectively and the testing apparatus to be electrically coupled with each other and a second adaptor part provided with a plurality of via holes for allowing a plurality of wirings electrically coupled to a plurality of second pins of the device under test respectively and the testing apparatus to be electrically coupled with each other.

The test fixture may include a plurality of coaxial pogo pins provided at positions corresponding to the first adaptor part and electrically coupled to the plurality of coaxial connectors respectively and a plurality of signal pins and a plurality of ground pins provided at positions corresponding to the second adaptor part and electrically coupled to the plurality of via holes respectively.

According to the third second aspect of the present invention, a testing system for testing a device under test, includes a testing apparatus for generating a test signal to test the device under test and judging quality of the device under test, a performance board on which the device under test is mounted and a test fixture for allowing the testing apparatus and the performance board to be mechanically coupled with each other and allowing the testing apparatus and the device under test to be electrically coupled with each other, wherein the performance board includes a female connector positioned to be biased toward the test fixture against a contact surface of the performance board and the test fixture, the test fixture includes a male connector positioned to be biased toward the test fixture against a contact surface of the performance board and the test fixture and the performance board and the test fixture are electrically coupled with each other by the female and male connectors.

The performance board may further include a first base member including a projection part which projects in a direction from the contact surface to the test fixture, and the female connector is provided at an end of the projection part.

At least a part of the projection part may be a shape of which a cross-section becomes small in a direction from the performance board to the test fixture in order to lead the female connector to the male connector.

The test fixture may further include a second base member including a concave part dented in a direction from the contact surface to the test fixture, and the male connector may be provided at a bottom part of the concave part.

At least a part of the concave part may be a shape of which a cross-section becomes large in a direction from the test fixture to the performance board in order to lead the female connector to the male connector.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 3:
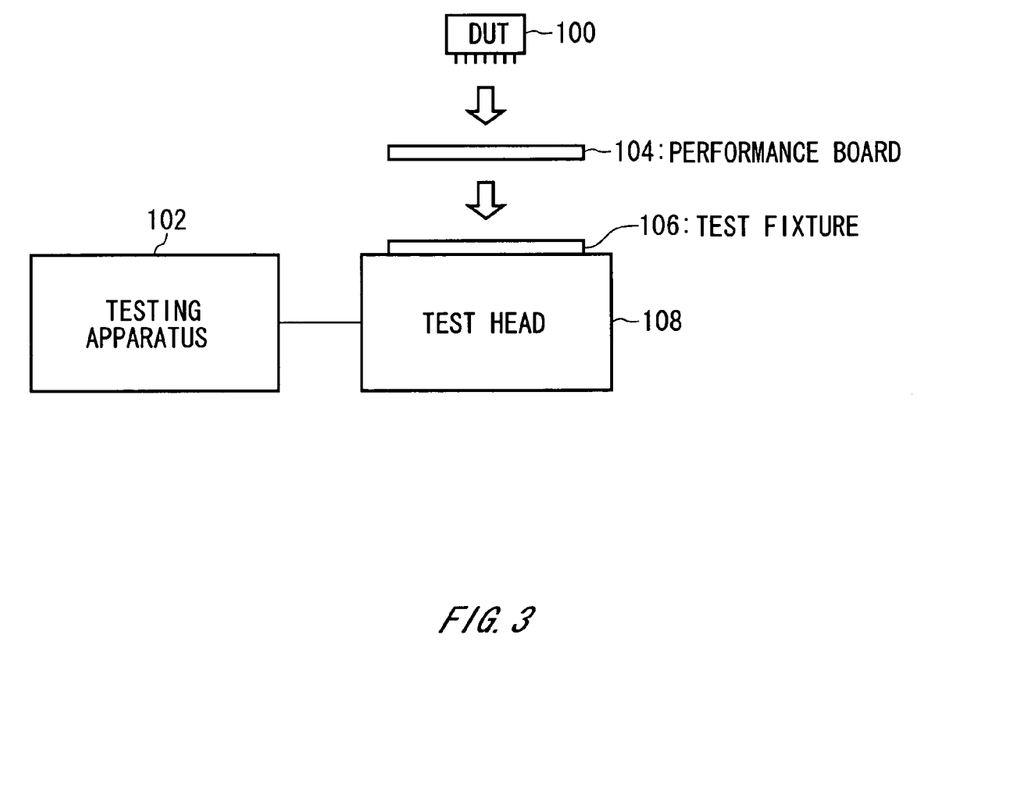
FIG. 3 shows an example of the configuration of a testing system according to the present invention.

FIG. 3 shows an example of the configuration of a testing system according to an exemplary embodiment of the present invention. The testing system includes a testing apparatus 102 for generating test signals to test a device under test 100 and judging the quality of the device under test 100, a performance board 104 on which the device under test 100 is mounted and a test head 108 including a test fixture 106 such as a Hi-Fix for allowing the testing apparatus 102 and the performance board 104 to be coupled with each other mechanically. The performance board 104 and the test fixture 106 allow the device under test 100 to be coupled to the testing apparatus 102 electrically via the test head 108. In addition, the testing apparatus 102 supplies test signals to the device under test 100 via the performance board 104 and the test head 108 to perform the test.

It is an object of the testing system of the present invention to perform various tests such as a RF test, a baseband test, a logic test and the like on the device under test 100 that is an SOC device, on which various circuits such as an RF front-end circuit, a baseband circuit, a logic test circuit and the like are formed, over a broadband with high precision and further to improve the operability of a user significantly.

Figure 4:
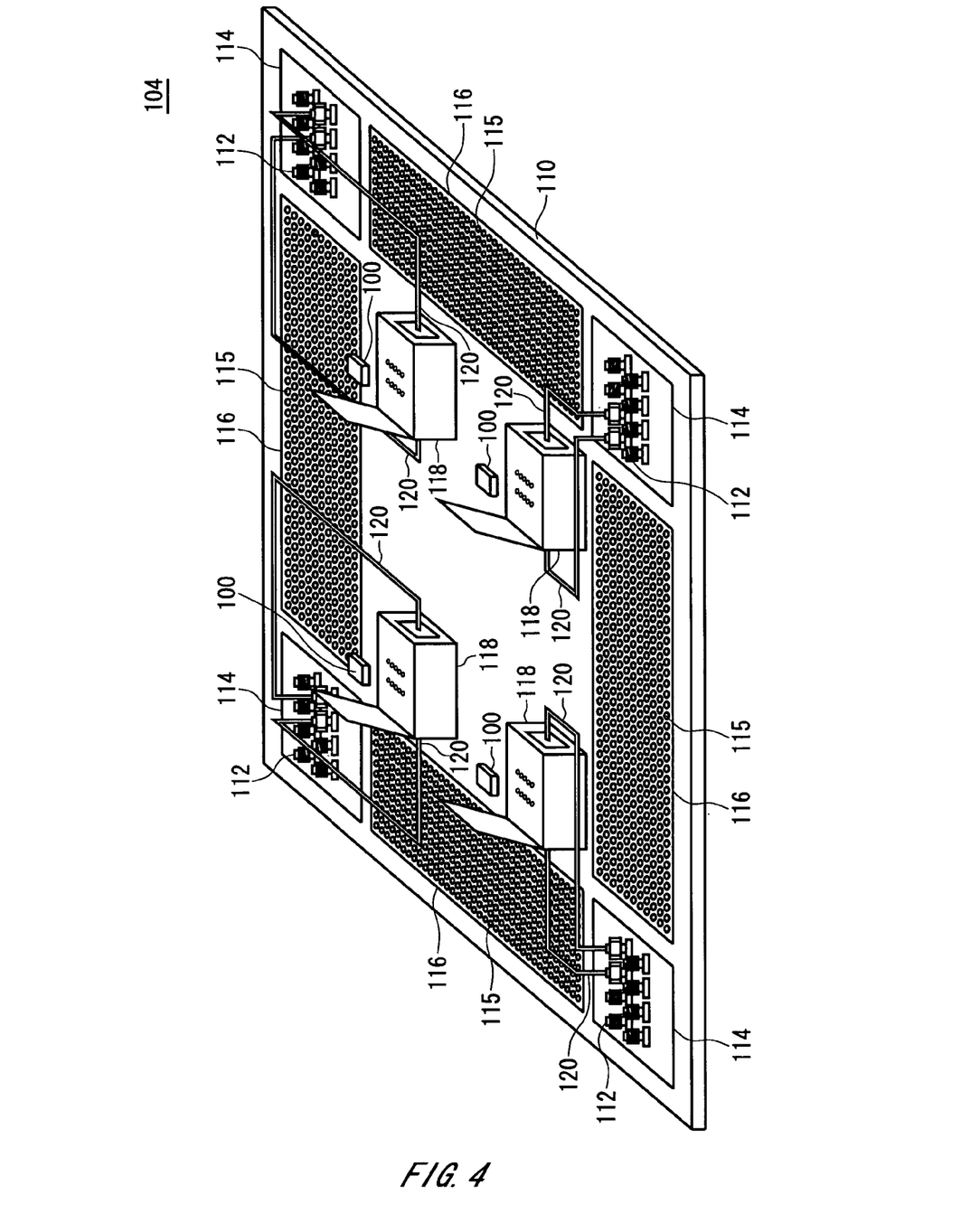
FIG. 4 shows an example of the configuration of a performance board 104.

FIG. 4 shows an example of the configuration of the performance board 104 according to the present embodiment. The performance board 104 includes a base substrate 110 on which the device under test 100 is mounted, a first adaptor part 114 provided with a plurality of coaxial connectors 112 and a second adaptor part 116 provided with a plurality of via holes 115.

The plurality of coaxial connectors 112 allow coaxial cables 120 electrically coupled to a plurality of pins of the device under test 100 respectively and the testing apparatus 102 to be coupled with other electrically. In addition, the plurality of via holes 115 allow a plurality of wirings electrically coupled to other plurality of pins of the device under test 100 respectively and the testing apparatus 102 to be coupled with each other electrically. The plurality of pins of the device under test 100 is coupled to the plurality of coaxial cables 120 or the plurality of wirings by an RF test head 118 respectively. It is preferable that a plurality of wiring patterns coupled to other plurality of pins of the device under test 100 respectively is provided on a surface of the base substrate 110, so that the plurality of via holes 115 can be coupled to other plurality of pins of the device under test 100 electrically by the plurality of wiring patterns. The wiring patterns may be microstrip lines. In addition, the plurality of via holes 115 may be electrically coupled to other plurality of pins of the device under test 100 respectively by wiring cables via connectors such as D-sub connectors provided in the RF test head 118.

The performance board 104 may include a plurality of first adaptor parts 114 and a plurality of second adaptor parts 116. In addition, the second adaptor part 116 may be provided to be closer to the device under test 100 than the first adaptor part 114. Since the device under test 100 is electrically coupled to the via holes 115 through the wiring patterns and electrically coupled to the coaxial connectors 112 through the coaxial cables such as semi-rigid cables, it is preferably provided to be closer to the via holes 115 than the coaxial connectors 112.

Particularly, the first adaptor part 114 is provided near a corner of the base substrate 110 of a rectangular shape, and the second adaptor part 116 is provided along a side of the base substrate 110, wherein an end of the side is the corner near which the first adaptor part 114 is provided. In addition, the second adaptor parts 116 may be provided along two sides of the base substrate 110 respectively, wherein an end of the sides is the corner near which the first adaptor part 114 is provided. In addition, the first adaptor parts 114 may be provided near a plurality of corners of the base substrate 11 respectively, and the second adaptor parts 116 may be provided along a plurality of sides of the base substrate 110 respectively.

By arranging the first adaptor parts 114 and the second adaptor parts 116 on the performance board 104 as described above, it is possible to make the distance between the device under test 100 and the via holes 115 shorter than the distance between the device under test 100 and the coaxial connectors 112. Accordingly, even if the device under test 100 and the via holes are coupled with each other by the wiring patterns, the deterioration of precision caused by the performance error due to the frequency characteristics of the wiring patterns, the cross torque between the wiring patterns, the drawing-around of the wiring patterns and/or the like can be prevented, and thus it is possible to perform the tests of the device under test 100 such as the logic test, the baseband test and the like.

Figure 5:
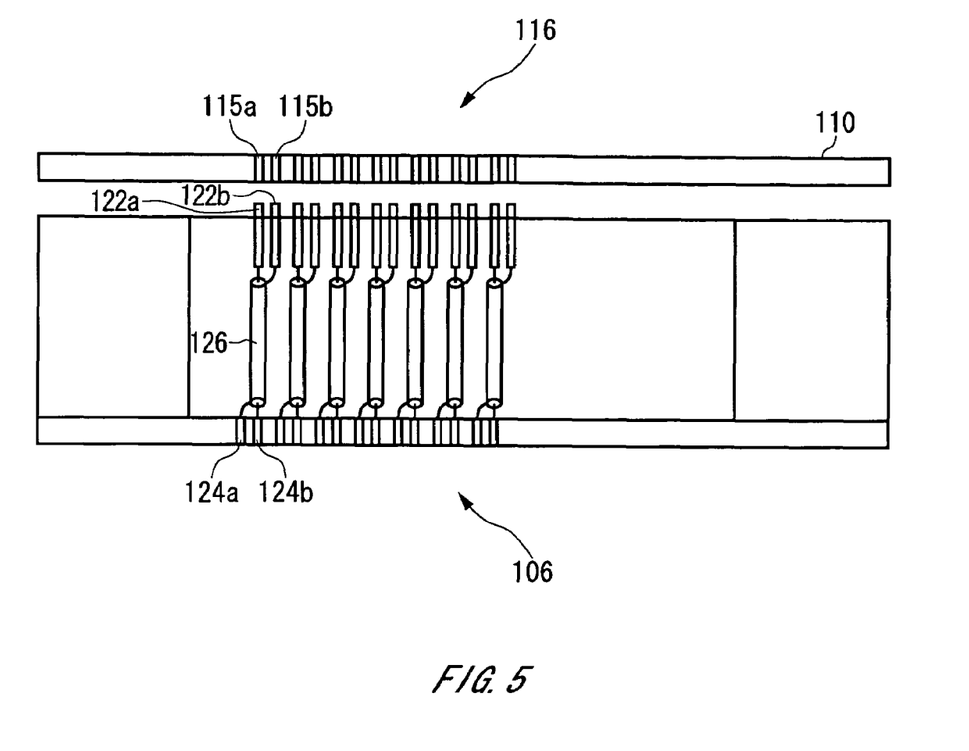
FIG. 5 shows an example of the configuration of parts of a second adaptor part 116 and a test fixture 106.

FIG. 5 shows an example of the configuration of parts of the second adaptor part 116 and the test fixture 106 according to the present embodiment. The second adaptor part 116 includes a plurality of via holes 115a and 115b provided in the base substrate 110. The via holes 115a are electrically coupled to the device under test 100 via wirings such as the wiring patterns provided on the base substrate 110.

In addition, the test fixture 106 includes a pogo pin array provided at a position of an upper surface of the test fixture 106 corresponding to the second adaptor part 116 and including a plurality of signal pins 122a and a plurality of ground pins 122b electrically coupled to the plurality of via holes 115a and 115b respectively, a plurality of via holes 124a and 124b provided at a lower surface of the test fixture 106 and a plurality of coaxial cables 126 for allowing the signal pins 122a and the via holes 124a to be electrically coupled with each other and the ground pins 122b and the via holes 124b to be electrically coupled with each other. The plurality of via holes 124a and 124b is electrically coupled to a plurality of signal pins and a plurality of ground pins provided in the test head 108 body respectively.

Since the second adaptor part 116 and the test fixture 106 are coupled with each other by the plurality of via holes 115a and 115b and the plurality of signal pins 122a and the plurality of ground pins 122b, attaching or detaching is easy so that the operability is excellent.

In addition, as an alternative embodiment, the second adaptor part 116 may include a pogo pin array including a plurality of signal pins and a plurality of ground pins instead of the plurality of via holes 115a and 115b, and the test fixture 106 may include a plurality of via holes instead of a plurality of signal pins 122a and a plurality of ground pins 122b. And, the second adaptor part 116 and the test fixture 106 may be coupled with each other mechanically and electrically by the plurality of signal pins and the plurality of ground pins of the second adaptor part 116 and the plurality of via holes of the test fixture 106.

Figure 6:
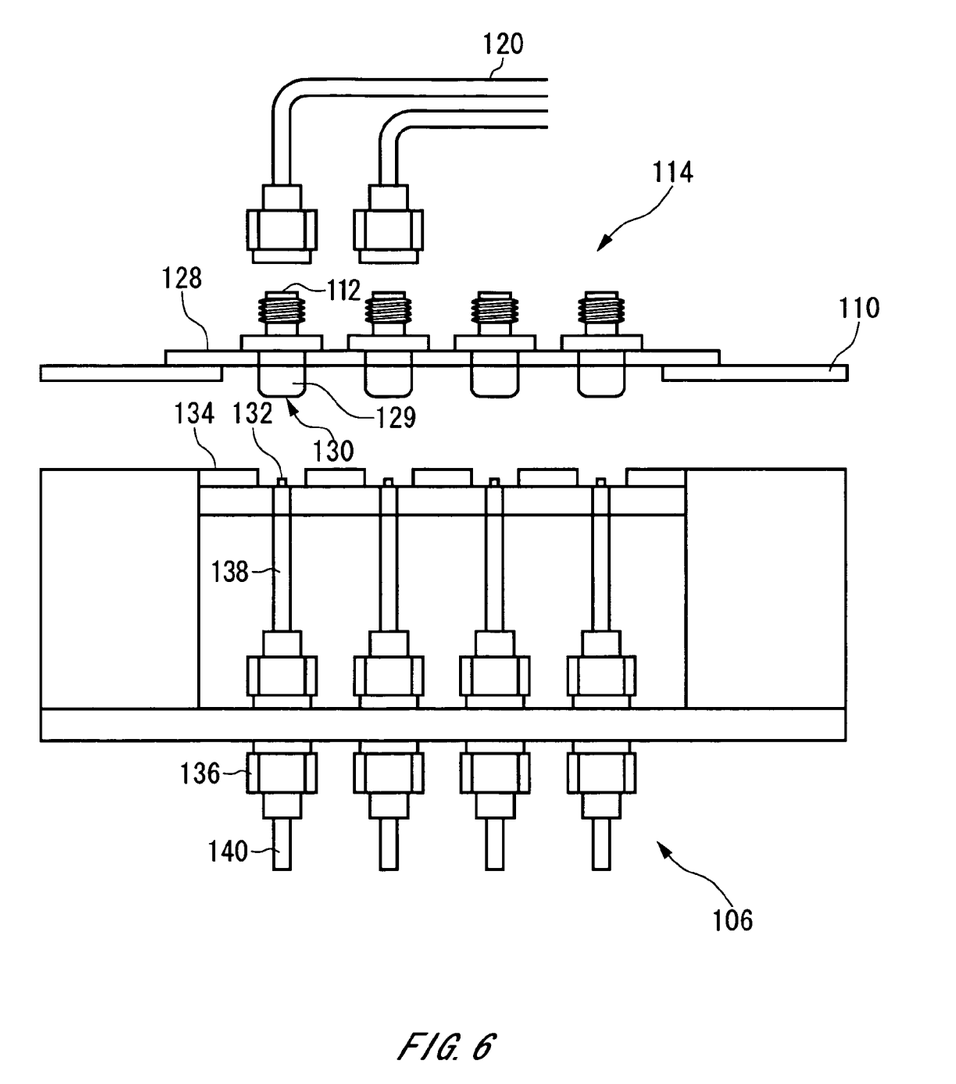
FIG. 6 shows an example of the configuration of parts of a first adaptor part 114 and a test fixture 106.
Figure 7:
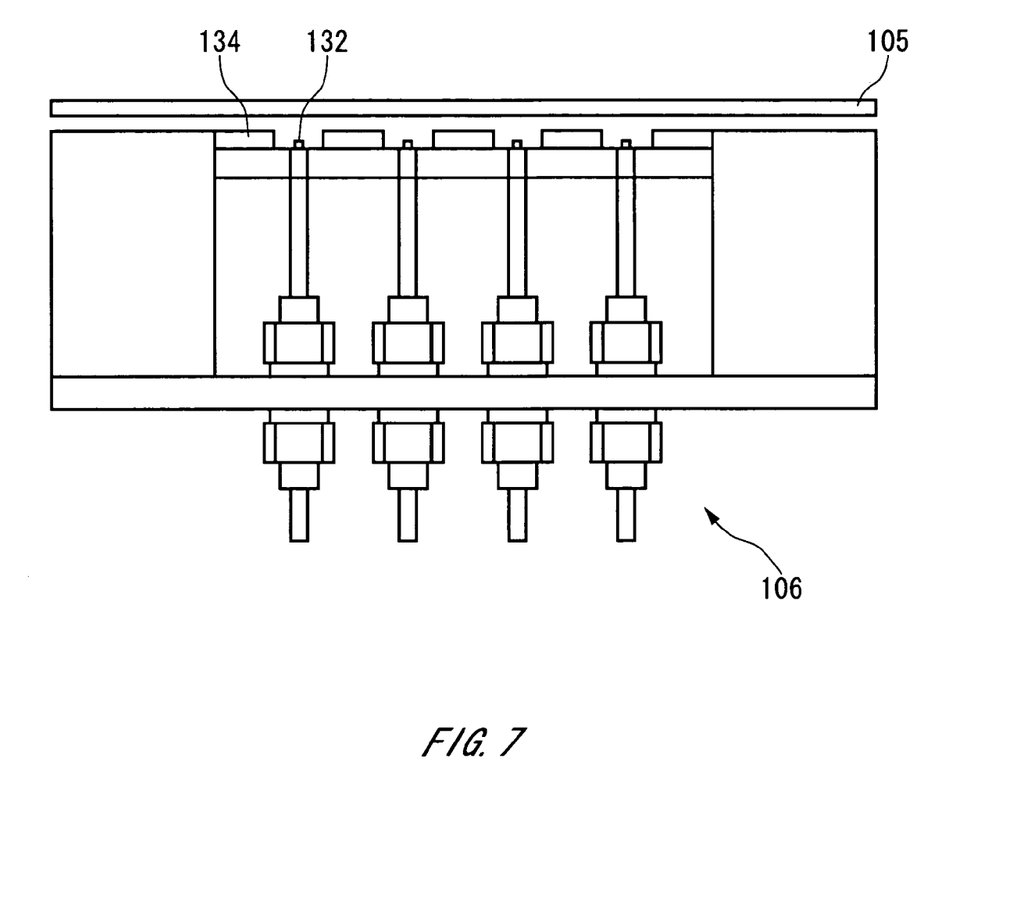
FIG. 7 shows an example of the configuration of a part of a test fixture 106.

FIG. 6 shows an example of the configuration of parts of the first adaptor part 114 and the test fixture 106 according to the present embodiment. FIG. 7 shows an example of the configuration of a part of the test fixture 106 according to the present embodiment. The first adaptor part 114 includes an adaptor substrate 128 positioned to be substantially parallel to the base substrate 110 and provided with a plurality of coaxial connectors 112 and base member 129 having projection parts projecting from a contact surface with the test fixture 106 toward the test fixture 106.

The adaptor substrate 128 is provided to cover an opening formed at the base substrate 110, and the coaxial connectors 112 are provided to penetrate the adaptor substrate 128 and the base member 129. The coaxial connectors 112 are coupled to the coaxial cables 120 in regard to an upper surface of the adaptor substrate 128 and include female connectors 130 on a lower surface of the adaptor substrate 128. The female connectors 130 are provided at ends of the projection parts of the base member 129, and positioned to face the test fixture 106 from the contact surface of the performance board 104 and the test fixture 106. In other words, the ends of the female connectors 130 are provided to be lower than the contact surface of the performance board 104 and the test fixture 106. The coaxial connectors 112 are preferably SMA connectors and may be blind-mate connectors.

The test fixture 106 includes a plurality of coaxial pogo pins 132 provided at a position of the upper surface of the test fixture 106 corresponding to the first adaptor part 114 and electrically coupled to the plurality of coaxial connectors 112 respectively, a base member 134 including concave parts dented in a direction from the contact surface of the performance board 104 and the test fixture 106 to the test fixture 106, a plurality of coaxial connectors 136 provided on a lower surface of the test fixture 106 and a plurality of coaxial cables 138 for allowing the coaxial pogo pins 132 and the coaxial connectors 136 to be coupled with each other electrically. The plurality of coaxial connectors 136 are electrically coupled to the body of the test head 108 respectively via a plurality of coaxial cables 140.

The coaxial pogo pins 132 which are an example of male connectors of the present invention are coupled to the female connectors 130 of the coaxial connectors 112. The coaxial pogo pins 132 are provided at bottom parts of the concave parts of the base member 134 and positioned to be biased toward the test fixture 106 against the contact surface of the performance board 104 and the test fixture 106. In other words, the ends of the coaxial pogo pins 132 are positioned to be lower than the contact surface of the performance board 104 and the test fixture 106.

The first adaptor part 114 and the test fixture 106 are coupled with each other mechanically and electrically by the female connectors 130 of the coaxial connectors 112 and the coaxial pogo pins 132, i.e. the male connectors. Accordingly, attaching or detaching of the first adaptor part 114 and the test fixture 106 is easy so that the operability is excellent. In addition, since the first adaptor part 114 and the test fixture 106 are coupled with each other by the coaxial pogo pins 132 and the male connector 130 whose life span is hundreds of thousands times, the contact performance of RF band (~18 GHz) can be maintained and the life span can be extended significantly in comparison to a case of being coupled by the blind-mate connectors. Particularly, since the life span of the blind-mate connector is about 5 thousands times, the life span can be extended 20 times by using the coaxial pogo pins 132 whose life span is 100 thousands times.

In addition, as shown in FIG. 7, since the coaxial pogo pins 132 are provided at the bottom parts of the concave parts of the base member 134 and positioned to be biased toward the test fixture 106 against the contact surface of the performance board 104 and the test fixture 106, if the test of the device under test 100 is performed by using the performance board 104 not having the first adaptor part 114, the performance board 104 and the coaxial pogo pins 132 are not in contact with each other. Accordingly, a space above the coaxial pogo pins 132 in regard to the performance board 104 can be utilized effectively such that the wiring patterns can be formed.

Figure 8:
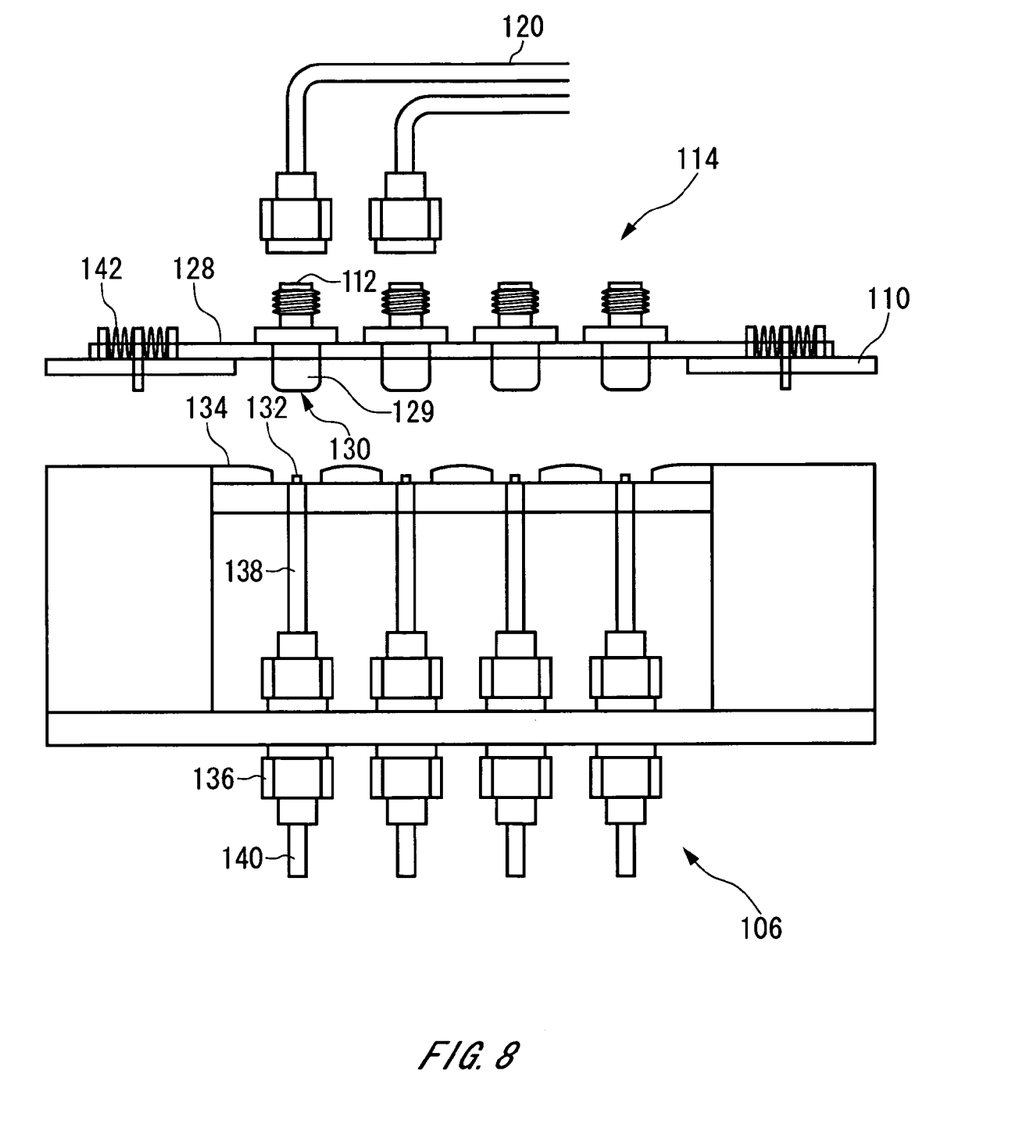
FIG. 8 shows a first modified example of a first adaptor part 114.

FIG. 8 shows a first modified example of the first adaptor part 114 according to the present embodiment. The function and configuration of each element of the present modified example will not be described below and are similar to those described in relation to FIG. 6.

The first adaptor part 114 has a floating function in order to allow the position of the adaptor substrate 128 to change against the base substrate 110. For example, the first adaptor part 114 includes a spring member 142 that is an example of an elastic member provided on the adaptor substrate 128 as the floating function. The spring member 142 stretches or contracts in a direction within surfaces of the base substrate 110 and the adaptor substrate 128, so that the position of the adaptor substrate 128 can be changed against the base substrate 110. In addition, the first adaptor part 114 may include a spring member 142 stretching or contracting in a first direction and a spring member 142 stretching or contracting in a direction substantially perpendicular to the first direction. In addition, the first adaptor part 114 may include a plurality of spring members 142 stretching or contracting in the first direction or may include a plurality of spring members 142 stretching or contracting in a direction substantially perpendicular to the first direction.

In addition, at least certain regions of the projection parts of the base member 129 have shapes whose cross-sections become small in a direction from the performance board 104 to the test fixture 106 in order to lead the female connectors 130 toward the coaxial pogo pins 132 that are the male connectors. For example, the ends of the projection parts of the base member 129 are circular or conical shapes. In addition, at least certain regions of the concave parts of the base member 134 have shapes whose cross-sections become large in a direction from the performance board 104 to the test fixture 106 in order to lead the female connectors 130 toward the coaxial pogo pins 132 that are the male connectors. For example, the cross-sections of the concave parts of the base member 134 are Y shapes.

By the floating function for allowing the position of the adaptor substrate 114 to change against the base substrate 110 by the spring member 142 described above, the positions of the coaxial connectors 112 can be corrected automatically. In addition, by the shapes of the projection parts of the base member 129 and the shapes of the concave parts of the base member 134 described above, the female connectors 130 of the coaxial connectors 112 can be easily leaded to the coaxial pogo pins 132 that are the male connectors. Accordingly, the female connectors 130 and the coaxial pogo pins 132 that are the male connectors can be properly coupled with each other.

In addition, the coaxial cables 120 are preferably pliable cables such as semi-flexible cables. Since the coaxial cables 120 are pliable, it can perform the floating function effectively.

Figure 9:
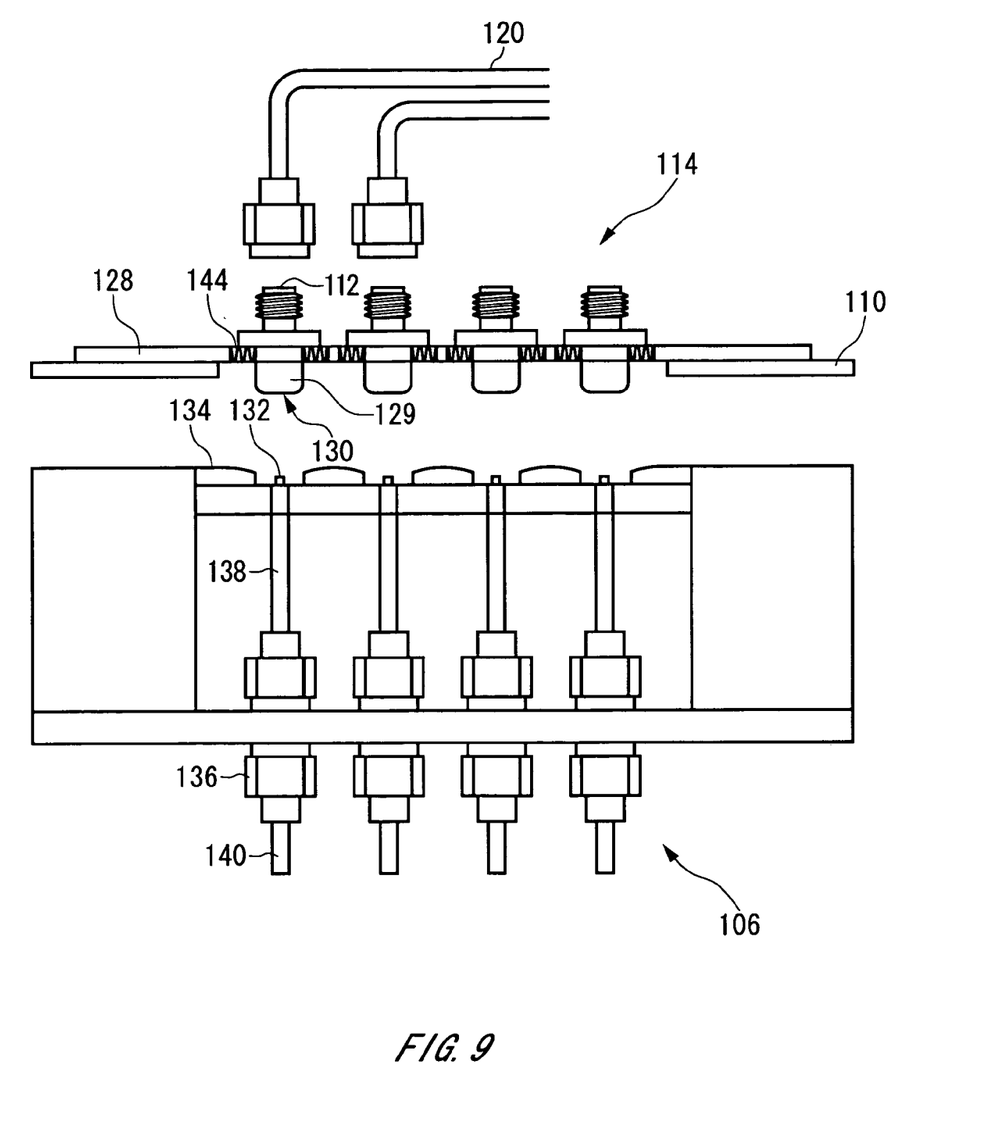
FIG. 9 shows a second modified example of a first adaptor part 114.

FIG. 9 shows a second modified example of the first adaptor part 114 according to the present embodiment. The function and configuration of each element of the present modified example will not be described below and are similar to those described in relation to FIG. 8.

The first adaptor part 114 has the floating function in order to allow the positions of the plurality of coaxial connectors 112 to change against the base substrate 110. For example, the first adaptor part 114 includes spring members 144 that are an example of elastic members provided at the plurality of coaxial connectors 112 respectively as the floating function. The spring members 144 are provided between the plurality of coaxial connectors 112 and the adaptor substrate 128 respectively and stretch or contract in a direction within a surface of the adaptor substrate 128, so that each of the positions of the coaxial connectors 112 can be changed against the adaptor substrate 128 respectively. In addition, the first adaptor part 114 may include spring members 144 stretching or contracting in a first direction and spring members 144 stretching or contracting in a direction substantially perpendicular to the first direction. Moreover, the first adaptor part 114 may include a plurality of spring members 144 stretching or contracting in the first direction or may include a plurality of spring members 144 stretching or contracting in a direction substantially perpendicular to the first direction.

By the floating function for allowing the positions of the coaxial connectors 112 to change against the adaptor substrate 128 by the spring members 144 described above, each of the positions of the coaxial connectors 112 can be corrected automatically, and the female connectors 130 of the coaxial connectors 112 and the coaxial pogo pins 132 that are the male connectors can be properly coupled with each other.

In addition, the floating function is preferably performed by combining the floating function of the adaptor substrate described in relation to FIG. 8 and the floating function of the coaxial connectors 112 described in relation to FIG. 9. The allowable range of the floating function (the elastic member 142) of the adaptor substrate 128 is larger than that of the floating function (the elastic members 144) of the coaxial connectors 112, and thus the positions of the first adaptor part 114 and the test fixture 106 are adjusted in a large scale by the floating function of the adaptor substrate 128 and the positions of the female connectors 130 and the coaxial pogo pins 132 are adjusted in detail by the floating function of the adaptor substrate 128. For example, the allowable range of the floating function of the adaptor substrate 128 is given by ±2 mm and the allowable range of the floating function of the coaxial connectors 112 by ±1 mm. By combining two floating functions the female connectors 130 and the coaxial pogo pins 132 can be properly coupled with each other.

Figure 10:
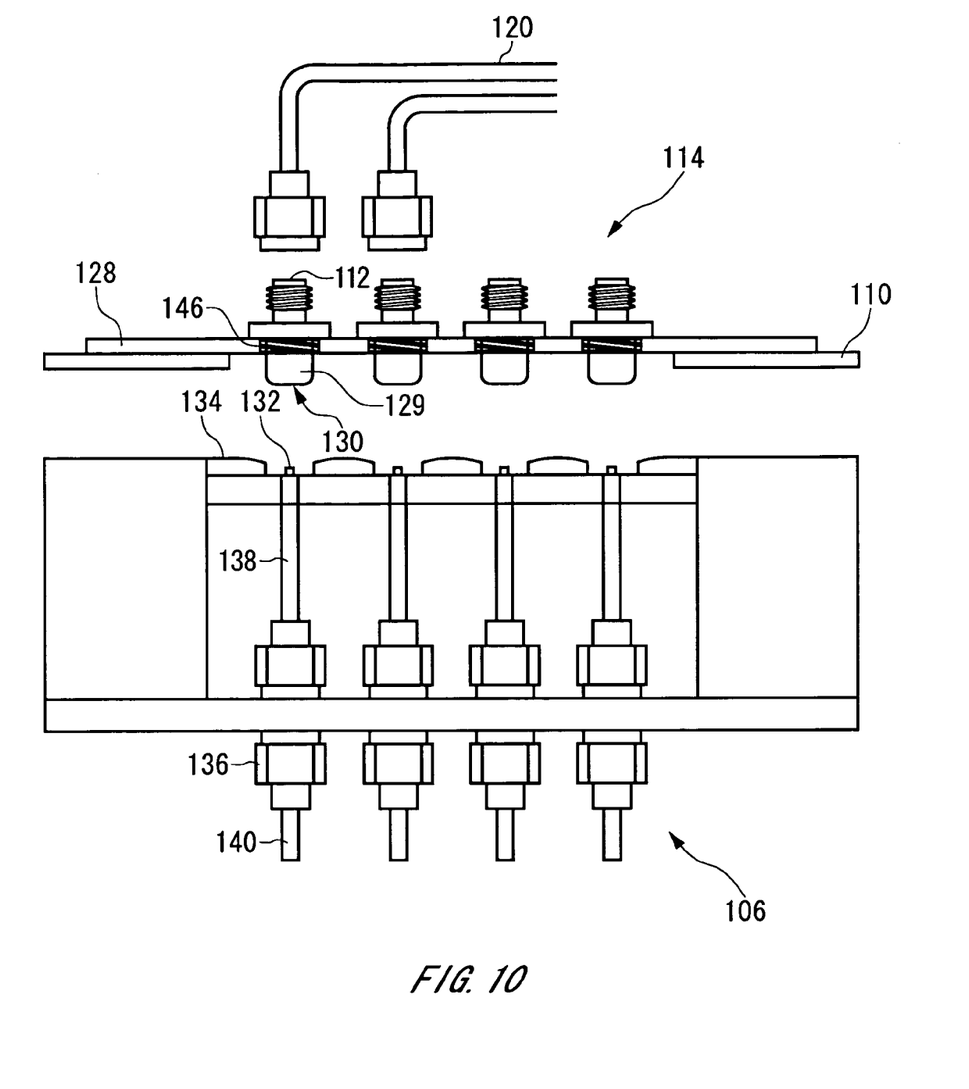
FIG. 10 shows a third modified example of a first adaptor part 114.

FIG. 10 a third modified example of the first adaptor part 114 of according to the present embodiment. The function and configuration of each element of the present modified example will not be described below and are similar to those described in relation to FIG. 8.

The first adaptor part 114 has spring members 146 that are an example of elastic members provided at the plurality of coaxial connectors 112 respectively in order to allow the positions of the plurality of coaxial connectors 112 to change against the base substrate 110. The spring members 146 are provided between the plurality of coaxial connectors 112 and the adaptor substrate 128 respectively coiling around the coaxial connectors 112 and stretch or contract in normal directions to the adaptor substrate 128, so that each of the positions of the coaxial connectors 112 can be changed against the adaptor substrate 128 respectively.

By the floating function for allowing the positions of the coaxial connectors 112 to change against the adaptor substrate 128 by the spring members 146 described above, each of the positions of the coaxial connectors 112 can be corrected automatically, and the female connectors 130 of the coaxial connectors 112 and the coaxial pogo pins 132 that are the male connectors can be properly coupled with each other.

Although the present invention has been described by way of exemplary embodiments, it should be understood that those skilled in the art might make many changes and substitutions without departing from the spirit and the scope of the present invention, which is defined only by the appended claims.

INDUSTRIAL APPLICABILITY

As obvious from the description above, according to the present invention, it is possible to provide a performance board and a testing system capable of performing the RF test of an SOC device over a broadband with high precision, and further improving the operability of a user considerably.

What is claimed is:

1. A performance board for allowing a device under test and a testing apparatus to be electrically coupled with each other, comprising:
    a base substrate on which said device under test is mounted;
    a first adaptor part provided with a plurality of coaxial connectors for allowing a plurality of coaxial cables electrically coupled to a plurality of first pins of said device under test respectively and said testing apparatus to be electrically coupled with each other; and
    a second adaptor part provided with a plurality of via holes for allowing a plurality of wirings electrically coupled to a plurality of second pins of said device under test respectively and said testing apparatus to be electrically coupled with each other,
    wherein said coaxial cable and said coaxial connector transfer an RF signal, and
    wherein the performance board is mechanically coupled to the testing apparatus through a test fixture, and the testing apparatus is electrically coupled to the device under test through the test fixture.

2. A performance board as claimed in claim 1, wherein said base substrate is provided with a plurality of wiring patterns coupled to said plurality of second pins of said device under test respectively, and said plurality of via holes are electrically coupled to said plurality of second pins of said device under test respectively by said wiring patterns.

3. A performance board for allowing a device under test and a testing apparatus to be electrically coupled with each other, comprising:
    a base substrate on which said device under test is mounted;
    a first adaptor part provided with a plurality of coaxial connectors for allowing a plurality of coaxial cables electrically coupled to a plurality of first pins of said device under test respectively and said testing apparatus to be electrically coupled with each other; and
    a second adaptor part provided with a plurality of via holes for allowing a plurality of wirings electrically coupled to a plurality of second pins of said device under test respectively and said testing apparatus to be electrically coupled with each other,
    wherein said coaxial cable and said coaxial connector transfer an RF signal, and
    wherein said first adaptor part comprises:
    an adaptor substrate arranged to be substantially parallel to said base substrate and provided with said plurality of coaxial connectors; and
    a first elastic member provided at said adaptor substrate in order to allow a position of said adaptor substrate to change against said base substrate.

4. A performance board as claimed in claim 3, wherein said first elastic member is a spring member stretching and/or contracting in a direction within surfaces of said base substrate and said adaptor substrate.

5. A performance board for allowing a device under test and a testing apparatus to be electrically coupled with each other, comprising:
    a base substrate on which said device under test is mounted;
    a first adaptor part provided with a plurality of coaxial connectors for allowing a plurality of coaxial cables electrically coupled to a plurality of first pins of said device under test respectively and said testing apparatus to be electrically coupled with each other; and a second adaptor part provided with a plurality of via holes for allowing a plurality of wirings electrically coupled to a plurality of second pins of said device under test respectively and said testing apparatus to be electrically coupled with each other, wherein said coaxial cable and said coaxial connector transfer an RF signal, and wherein said first adaptor part comprises:

an adaptor substrate arranged to be substantially parallel to said base substrate and provided with said plurality of coaxial connectors; and a plurality of second elastic members provided at said plurality of coaxial connectors respectively in order to allow positions of said plurality of coaxial connectors to change against said adaptor substrate.

6. A performance board as claimed in claim 5, wherein said second elastic members are spring members provided between said coaxial connectors and said second adaptor substrate and stretching and/or contracting in a direction within a surface of said adaptor substrate.

7. A performance board as claimed in claim 5, wherein said first adaptor part further comprises a first elastic member provided at said adaptor substrate in order to allow a position of said adaptor substrate to change against said base substrate, wherein an allowable range of said first elastic member is larger than an allowable range of said second elastic members.

8. A performance board as claimed in claim 1, wherein said second adaptor part is provided to be closer to said device under test than said first adaptor part.

9. A performance board as claimed in claim 8, wherein said base substrate is a rectangular shape, said first adaptor part is provided near a corner of said base substrate; and said second adaptor part is provided along a side of said base substrate, wherein said corner is an end of said side.

10. A performance board as claimed in claim 9, wherein said second adaptor parts are provided along two sides of said base substrate, wherein said corner is an end of said sides.

11. A performance board as claimed in claim 10, wherein said first adaptor parts are provided near a plurality of corners of said base substrate respectively, and said second adaptor parts are provided along a plurality of sides of said base substrate.

* * * * *